(12) United States Patent
Tozer

(10) Patent No.: US 7,728,684 B2
(45) Date of Patent: Jun. 1, 2010

(54) CRYSTAL REFERENCE CLOCK AND RADIO LOCALIZATION RECEIVER

(75) Inventor: Andrew Tozer, Cambridge (GB)

(73) Assignee: QUALCOMM Incorporated, San Diego, CA (US)

( * ) Notice: Subject to any disclaimer, the term of this patent is extended or adjusted under 35 U.S.C. 154(b) by 42 days.

(21) Appl. No.: 11/898,185

(22) Filed: Sep. 10, 2007

(65) Prior Publication Data

US 2008/0174374 A1 Jul. 24, 2008

(30) Foreign Application Priority Data

Sep. 11, 2006 (EP) .................. 06120455

(51) Int. Cl.
*H03L 1/00* (2006.01)
(52) U.S. Cl. .................. 331/176; 331/18; 331/34; 331/37; 331/38; 331/39; 331/40; 331/41; 331/44; 331/46; 331/66; 331/73; 331/158; 331/175; 331/177 R
(58) Field of Classification Search .............. 331/18, 331/34, 37, 38, 39, 40, 41, 44, 46, 66, 73, 331/158, 175, 176, 177 R; 342/352, 357
See application file for complete search history.

(56) References Cited

U.S. PATENT DOCUMENTS

| | | | |
|---|---|---|---|
| 4,072,912 A | | 2/1978 | Pradal |
| 4,297,657 A * | 10/1981 | Frerking ................ 331/176 |
| 4,305,041 A * | 12/1981 | Frerking ................ 327/39 |
| 4,345,221 A | | 8/1982 | Zumsteg |
| 4,537,515 A | | 8/1985 | Dinger et al. |
| 4,616,173 A * | 10/1986 | Cook et al. ............. 324/76.62 |
| 4,899,117 A * | 2/1990 | Vig ................ 331/3 |
| 5,182,528 A * | 1/1993 | Zuta ................ 331/1 A |
| 5,216,389 A * | 6/1993 | Carralero et al. ........... 331/18 |
| 5,473,274 A * | 12/1995 | Reilly et al. ............ 327/159 |
| 6,710,663 B1 * | 3/2004 | Berquist ................ 331/3 |
| 6,831,525 B1 | 12/2004 | Beaudin et al. |
| 6,933,788 B2 | 8/2005 | Forrester |
| 2001/0016024 A1 * | 8/2001 | Treyer ................ 375/373 |
| 2002/0005765 A1 * | 1/2002 | Ashley et al. ............. 331/176 |
| 2003/0174025 A1 * | 9/2003 | Ho et al. ................ 331/180 |
| 2004/0142701 A1 * | 7/2004 | Abraham ................ 455/456.1 |

(Continued)

FOREIGN PATENT DOCUMENTS

EP 0 283 529 A1 9/1988

(Continued)

OTHER PUBLICATIONS

Brownlie, "CDXO Application Notes" [Online] May 24, 1996, pp. 1-7, XP002459843, Retrieved from the Internet: URL:http://www.rakon.co.nz/generated/rakpdf/CDXOappnote.pdf.

(Continued)

*Primary Examiner*—Arnold Kinkead
*Assistant Examiner*—Richard Tan
(74) *Attorney, Agent, or Firm*—Shyam K. Parekh

(57) ABSTRACT

Device and method for temperature compensation in a clock oscillator using quartz crystals, which integrates dual crystal oscillators. The minimal power consumption is achieved through an efficient use of a processor in charge of the synchronization of the two oscillators. The invention is particularly adapted for the provision of a precise reference clock in portable radiolocalization devices.

14 Claims, 3 Drawing Sheets

U.S. PATENT DOCUMENTS

2004/0164782 A1* 8/2004 Zampetti et al. ............ 327/292
2005/0007205 A1   1/2005 Bridger
2005/0195105 A1* 9/2005 McBurney et al. ....... 342/357.1
2006/0262884 A1* 11/2006 Wardrop et al. ............. 375/316

FOREIGN PATENT DOCUMENTS

| EP | 1 087 530 A1 | 3/2001 |
|---|---|---|
| EP | 1 475 885 A1 | 11/2004 |
| JP | 55-138626 A | 10/1980 |
| WO | WO 93/15555 A1 | 8/1993 |

OTHER PUBLICATIONS

Vittorini, et al., "Manufacturing Optimization for Improved AT Crystal Aging", Frequency Control Symposium, 1998, Proceedings of the 1998 IEEE International, Pasadena, CA USA May 27-29, 1998, New York, NY, pp. 132-139, XP010305535.

European Search Report—EP07114843, Search Authority—The Hague, Nov. 26, 2007.

* cited by examiner

US 7,728,684 B2

CRYSTAL REFERENCE CLOCK AND RADIO LOCALIZATION RECEIVER

REFERENCE DATA

The present application claims priority from European patent application EP06120455 filed on Sep. 11, 2006.

FIELD OF THE INVENTION

The current invention relates to a low-power management system addressing the problem of providing high stability frequency references despite temperature variations. This invention is meant to be integrated in GPS (Global Positioning System) devices which requires both clock precision for better performance and a long lifetime for commodity and ease of use in combination with other applications (e.g. so-called Assisted-GPS applications).

More specifically, the described invention relates to a method for temperature compensation in a clock oscillator using quartz crystals, which integrates dual crystal oscillators. The minimal power consumption is achieved through an efficient use of a processor in charge of the synchronisation of the two oscillators.

DESCRIPTION OF RELATED ART

For devices requiring a highly accurate clock precision like GPS devices or satellite radiolocalization devices in general, effective temperature compensation must be achieved. To this end, TCXO (Temperature compensated Crystal Oscillator) are often employed. The cost and power consumption of available TCXO devices, however, are high. Thus, there is a need for an alternative way of providing a highly accurate clock which is less expensive and has lower power demands.

Devices providing an accurate time base are known, which use two thermally linked quartz crystals having different temperature coefficients. In such devices one crystal, cut in a manner that minimizes the temperature coefficient, is usually used as the "reference" oscillator while the other crystal is regarded as a "temperature oscillator", in that it has a temperature coefficient which is quite linear with the temperature. In this way, the difference of the frequency generated by the two crystals univocally determines the common crystals' temperature, and can be used to correct the reference frequency, according to a known correction function.

An example of such quartz oscillators is known as CDXO (Calibrated Dual Crystal Oscillator). The appeal of such device reside in the fact that they comprise a memory which is factory programmed with an individual calibration function, coded for example as coefficients of a high order polynomial function, expressing the deviation of the "reference" oscillator as a function of the frequency difference between the two oscillators.

Usually the compensation for frequency deviation according to temperature is carried out by a Digital Signal Processor (DSP) that measures the frequency deviation of the "reference" oscillator based on the calibration function and on the inputs of the second oscillator. It communicates this frequency deviation to a numerically controlled oscillator (NCO) that numerically generates the reference frequency, for example 1 KHz for a 1 mS precise clock.

The correction function is, by nature, highly non-linear. These systems, therefore, may be difficult to integrate in portable GPS receiver, that require a very precise correction, in real-time, over a large temperature span, and in which the computing power is limited.

It is an object of the present invention to provide minimal processing power consumption while performing the compensation for the reference oscillator frequency drift depending on the temperature.

It is a further object of the invention to provide an optimised computer program carrying out the steps of the frequency compensation method.

BRIEF SUMMARY OF THE INVENTION

The above objects are attained by employing an architecture using no temperature, but solely a frequency related calibration function that is stored in a memory means and assessed with a stepwise linear estimation in order to correct the reference oscillator frequency according to the temperature variation. This requires fewer cycles of the Digital Signal Processor (DSP) in charge of determining the temperature dependent frequency drift; and hence allows for a lower processing power to carry out the correction. This is a very useful feature for GPS devices that precisely need low power management characteristics.

BRIEF SUMMARY OF THE DRAWINGS

The invention will be better understood with the drawing illustrated in

DETAILED DESCRIPTION OF THE INVENTION

Figure 1:
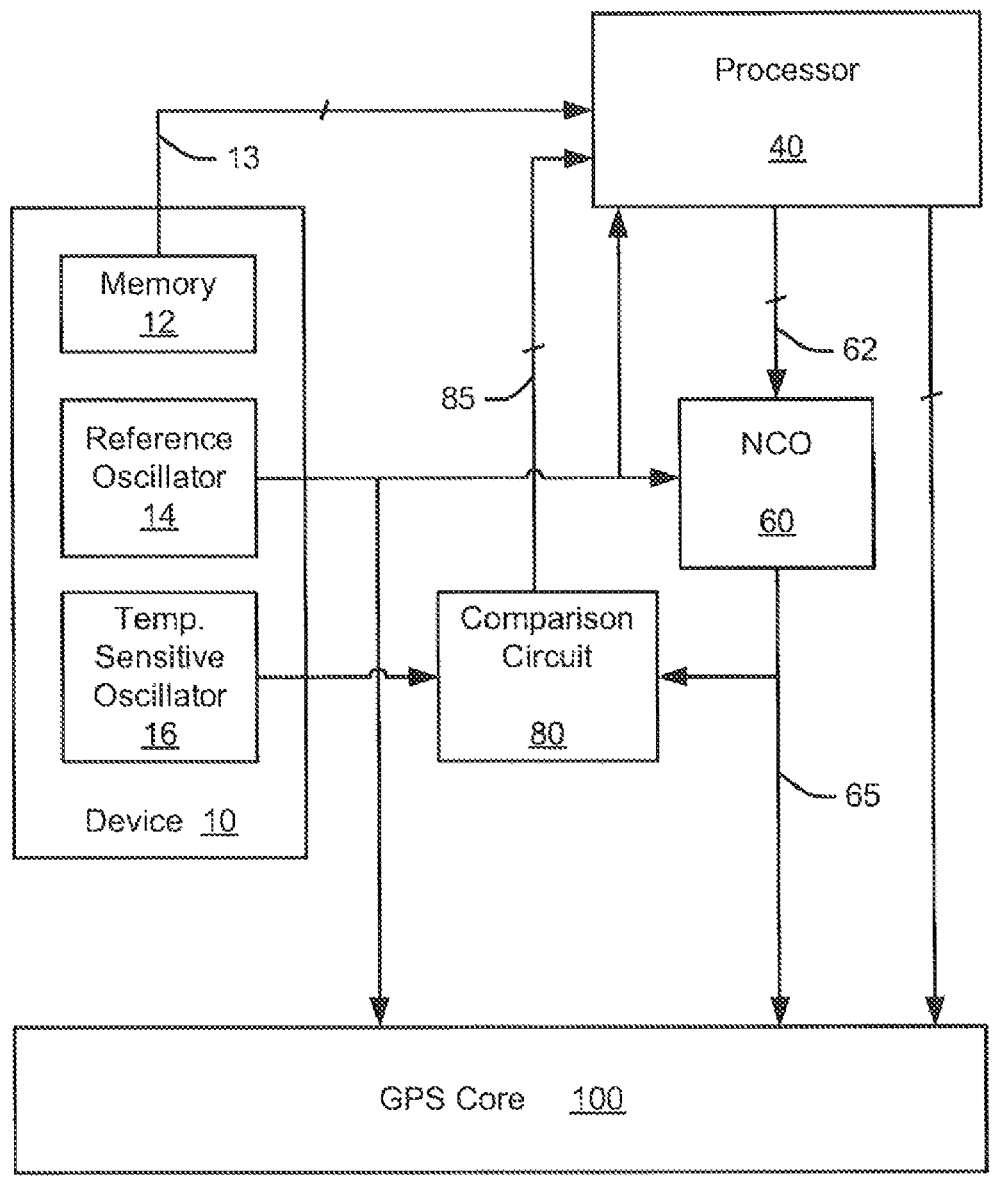
FIG. 1, which diagrammatically shows a radiolocalization device including a frequency reference according to the present invention.

With reference to FIG. 1, the invention employs a two crystal oscillators:

A first reference oscillator 14 which provides the main reference frequency. The reference oscillator is, for example a quartz crystal cut in order to resonate at the desired frequency. Typically this resonator will be a standard AT-cut crystal oscillator exhibiting a known $5^{th}$ order frequency versus temperature characteristics, and a temperature coefficient of around 15 ppm/degree, strongly variable in the operating range.

A second temperature sensitive oscillator 16, thermally coupled to the reference oscillator. This crystal may for example be a Y-cut quartz crystal with a temperature coefficient of 90 ppm/degree, approximately constant in the operating range of temperatures.

The resonators 14 and 16 are contained and thermally linked in the same device 10. It can then be assumed that both crystal have a common temperature. The device 10 contains also a memory area 12, for example a EEPROM or a ROM, programmed with a correction function, for example the coefficients of a $5^{th}$ order polynomial expressing the frequency deviation of the reference oscillator 14, as a function of the frequency difference between the reference oscillator 14 and the temperature sensitive oscillator 16. The calibration coefficients are stored in the device by the manufacturer. The content of the memory 12 is readable through an appropriate bus 13, for example a serial bus.

Optionally, if the memory area 12 should be user-writable (for example a flash memory), the calibration coefficients may be updated by the host system 40, for example to accommodate aging of the quartz crystals. This may be useful in radiolocalization devices in which the temperature calibration of the resonators 14 and 16 can be precisely verified, by comparison with the GPS time reference.

The two outputs of the two oscillators 14 and 16 are compared in the frequency comparator 80, in order to obtain a beat frequency which is temperature dependent, and whose characteristics with respect to temperature are stored in the memory means 12.

The radiolocalization receiver also comprises a GPS core 100, for performing known radiolocalization function together with a digital processor 40. According to the described example, the same digital processor 40 is also used to obtain a precise frequency reference from the dual crystal device 10. It will be understood, however, that the present invention also includes the case in which the frequency reference is provided by a separate processor, or by a dedicated circuit.

The signal generated by the reference oscillator 14 is used as time base for the numerically controlled oscillator 60 which delivers at its output a clock signal 65 to the GPS core 100. An increment value 62, provided by the DSP unit 40 has to be set in order to have the desired frequency of the clock signal, typically 1 kHz in the case of a GPS unit.

The clock signal 65 is also applied to the frequency comparison circuit 80, which generates a control signal 85 indicative of the relationship between the frequencies of the two oscillators 14 and 16. It will be understood that the frequency comparison circuit 80 could operate in several ways, within the framework of the invention. For example the comparison circuit 80 may include a mixer and possibly a low-pass filter, in order to extract a beat frequency equal to the difference of the frequencies 14 and 16, and a counter, to count the beats of the two oscillators in one millisecond: In alternative, the comparison circuit 80 may simply count the output of the temperature oscillator 16 in a time interval determined by the clock signal 65, from which the beat frequency can be derived by software in the DSP 40. We will assume, to fix the ideas, that the control signal 85 expresses the beat frequency between the reference oscillator 14 and the temperature oscillator 16, it being understood that the invention also comprises other variants in which the control signal carries, say, the ratio between the same frequencies.

Based on the control signal 85 the DSP 40, which as read beforehand the calibration coefficients from the memory 12 compute, periodically and in real-time, the increment value 62 for the NCO 60, in order to obtain a clock signal 65 having precisely the desired frequency, for all possible temperatures of the device 10.

Such a dual crystal system can provide a very fine resolution while employing an only frequency-related calibration function. Yet in order to achieve this with very frequent sampling times, the digital processor 40 can be quickly overloaded. It is therefore preferable to compute the instantaneous correction coefficients as an interpolation of the calibration polynomial. To this effect, for example, the DSP divides the expected range of the control signal 85 in a finite number of steps and fills in advance an interpolation table with the appropriate values to quickly calculate the interpolation function for each value of the control signal 85. The interpolation technique may be varied, according to the need. Preferably a piecewise linear interpolation is used.

In a preferred embodiment, a software program will carry out the described frequency control method with a scaling function, so that integers and no floating numbers will be manipulated, depending on the size of the registers used, in order to comply with the low power management policy of the invention in order to fit in with the requirements of GPS devices which are precisely characterised by low power characteristics.

Figure 2:
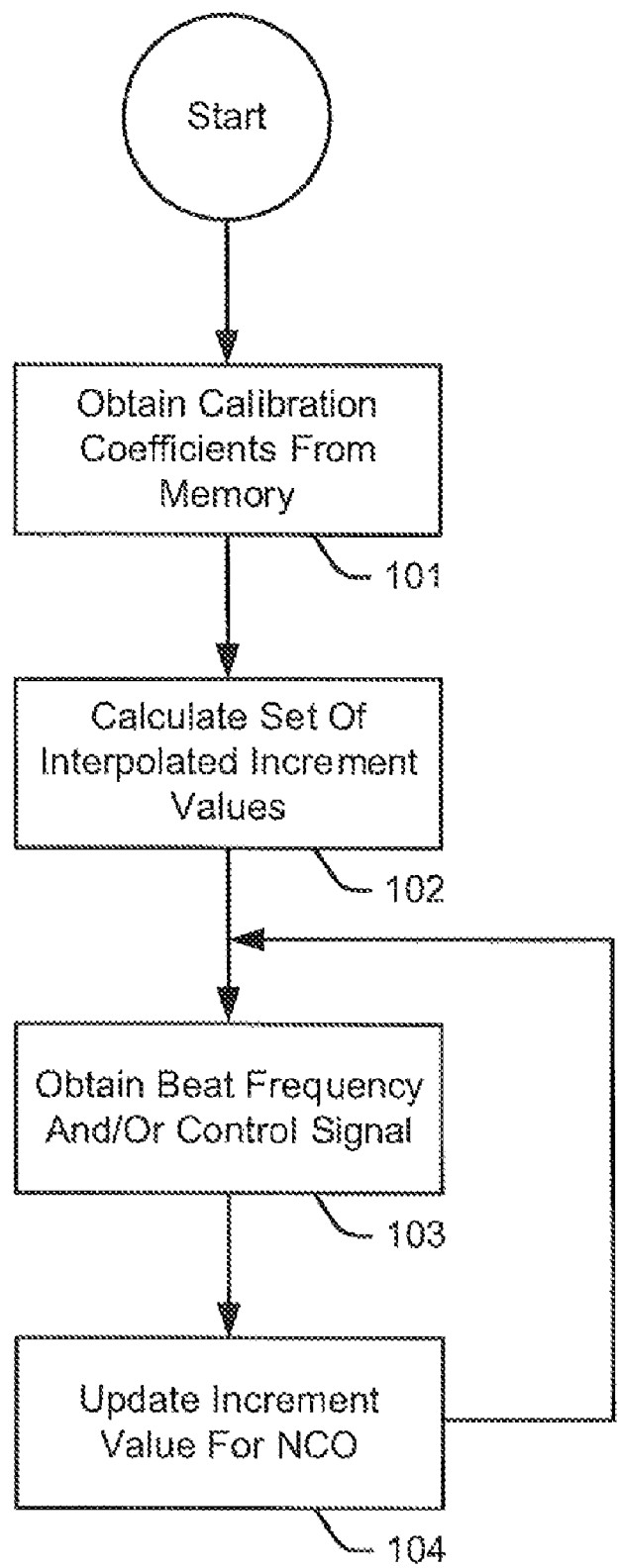
FIG. 2, which shows, in flowchart format, an example of frequency correction method according to the invention.

FIG. 2 represents, in a flowchart, the steps carried out by the DSP unit 40 for the frequency control method of the invention. In step 101, the DSP obtains the calibration coefficients from the memory area 12 of the device 10. Step 102 corresponds to the pre-calculation of the tables needed for the computation of the interpolated increment value 62.

Figure 3:
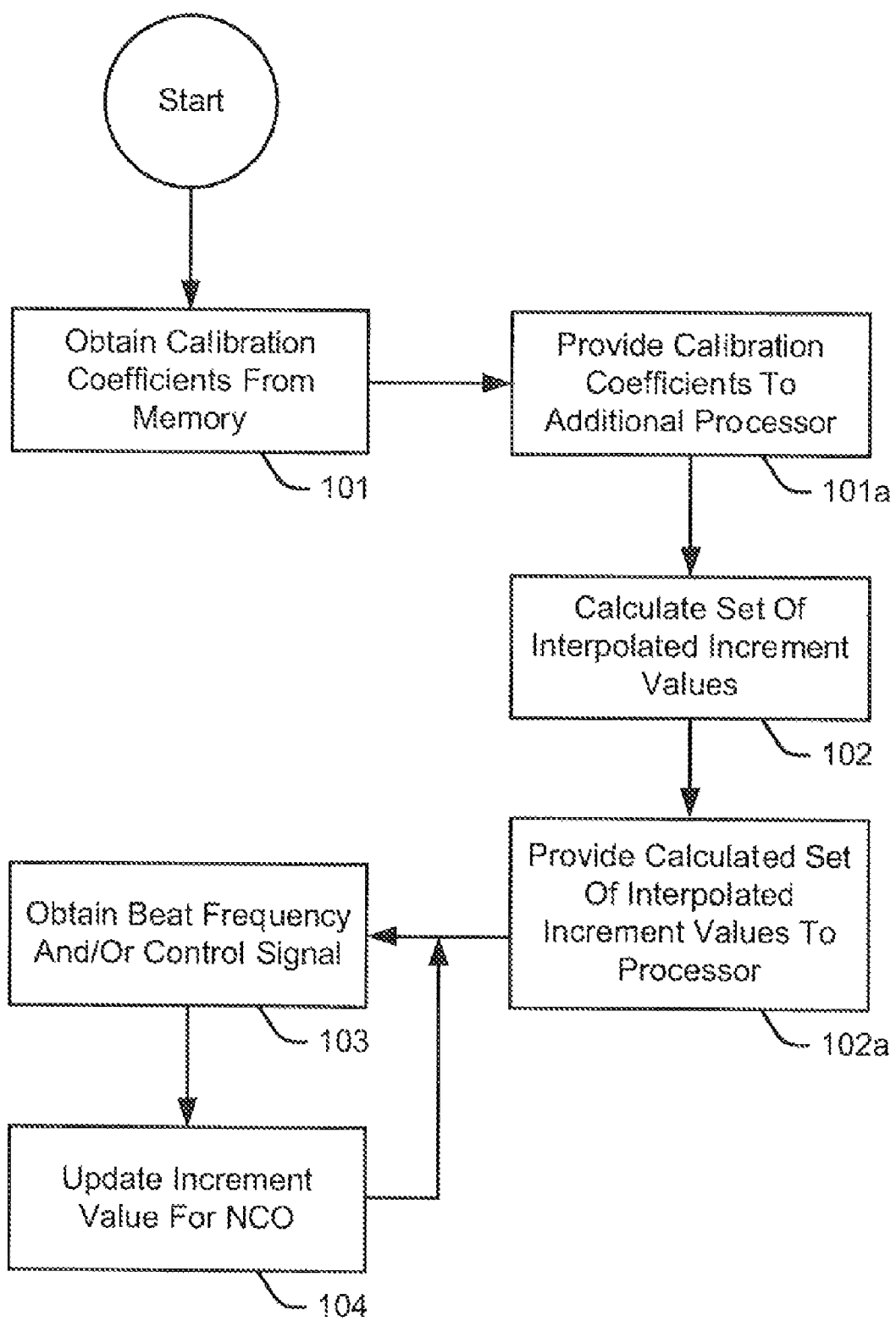
FIG. 3 represents, in a flowchart format, an alternative embodiment of the invention involving a additional processor in order to carry out the calculate the interpolation tables.

In an alternative embodiment of the invention whose flowchart is represented in FIG. 3, an additional processor could be used to calculate the interpolation tables. In this case, the additional processor would be connected to the DSP by means of a serial connection link or any other communication method. This would require the introduction of new steps 101a and 102a, where step 101a would pass the coefficient data from the DSP to the additional processor and step 102a would pass the data for the pre-calculated tables as obtained in step 102 from the additional processor to the DSP. In this case, step 102 would then be performed by the additional processor and not the DSP.

In step 103 the DSP reads the beat frequency or the control signal 85 from the comparison unit 80, and in step 104, the DSP 40 updates the increment value 62 for the NCO 60 based on the control signal 85 and on the values pre-calculated in step 102. Steps 103 and 104 repeat as long as needed, for example according to a periodic interrupt of the DSP 40.

We will now work out, in further mathematical detail, an example of the present invention.

To obtain an accurate indication of the deviation of the $F_{ref}$ frequency generated from the reference oscillator 14 from its nominal value, a 5th order polynomial is applied:

$$\Delta F_{ref} = C_0 + C_1 \cdot \Delta F_{beat} + C_2 \cdot \Delta F_{beat}^2 + C_3 \cdot \Delta F_{beat}^3 + C_4 \cdot \Delta F_{beat}^4 + C_5 \cdot \Delta F_{beat}^5 \quad (1)$$

$C_n$ are the coefficients of the polynomial calibration function obtained from the EEPROM 12, opportunely adjusted and scaled, if needed. $\Delta F_{beat}$ is the deviation of the beat frequency 85 from the expected beat frequency $F_{Beat\_nom}$ at the nominal frequency $F_{ref}$ and at the standard operating temperature, say 25° C., normalized over 1 second.

$$\Delta F_{beat} = (F_{beat} - F_{Beat\_nom}) \cdot 1000 / \text{Gatems} \quad (2)$$

Gatems is the period in ms over which the measurements are made.

$$F_{Beat\_nom} = F_{TempCount\_nom} - F_{RefCount\_nom} \quad (3)$$

$F_{TempCount\_Nom}$ is the predicted count of the $X_{Temp}$ signal generated by the temperature-dependent oscillator 16 at the nominal frequency and 25° C. $F_{RefCount\_Nom}$ is the predicted count of $X_{Ref}$ signal generated by the reference oscillator 14 at the nominal frequency and 25° C.

$$F_{TempCount\_nom} = GateCount \cdot (FX_{Temp} + F_{offset}) / FX_{Ref} \quad (4)$$
$$= (FX_{Temp} + F_{offset}) \cdot \text{Gatems} / 1000$$

$FX_{Temp}$ is the nominal frequency of the $X_{Temp}$ oscillator (in Hz) at 25° C. $F_{offset}$ is an offset frequency adjustment to $X_{Temp}$ obtained from the data in EEPROM 12. GateCount is the number of counts of $X_{Ref}$ in the measurement period.

$$GateCount = \text{Gatems} \cdot FX_{Ref} / 1000 \quad (5)$$

$FX_{Ref}$ is the nominal frequency of the $X_{Ref}$ oscillator (in Hz) at 25° C., but note that the term $FX_{Ref}/1000$ is actually the factor applied to obtain the 1 mS clock signal.

$$F_{RefCount\_nom} = \text{GateCount} \quad (6)$$

Hence restating equation 3

$$F_{Beat\_nom} = \text{GateCount} \cdot (FX_{Temp} + F_{offset})/FX_{Ref} - \text{GateCount} \quad (7)$$

There are two options for $F_{Beat}$ depending whether the system is configured to measure a Beat frequency-count, or to measure the count from $X_{Temp}$.

If the Beat frequency is being counted, then $$F_{beat} = \text{MeasuredCount} \quad (8)$$

Otherwise, if the count from $X_{temp}$ is measured, then $$F_{beat} = \text{MeasuredCount} - \text{GateCount} \quad (9)$$

In the presented example, The NCO uses a 39-bit counter and a 28-bit increment register. It is clear, however, that other arrangements are possible.

$$F_{req} = (\text{Incr} \cdot F_{ref})/2^{39} \quad (10)$$

$F_{req}$ is the desired frequency.
$F_{ref}$ is the input frequency.
Incr is the Increment value.
By rearranging we obtain $$\text{Incr} = (\text{Freq} \cdot 2^{39})/F_{ref} \quad (11)$$

Initially, and by default the NCO will be programmed with an nominal $\text{Incr}_{nom}$ value obtained from the nominal frequency of $X_{Ref}$ ($X_{Ref\_nom}$) to produce a one KHz signal by applying Equation 11.

When the control loop is active, periodically the system provides a frequency error for $X_{Ref}$. The NCO 60 must be adjusted to correct for any drift in the frequency of $X_{Ref}$. This will be done by applying Equation 11 where $F_{ref}$ is the nominal frequency of $X_{Ref}$, plus the change in frequency $\Delta F_{ref}$ obtained from Equation 1. Thus:

$$F_{ref} = X_{Ref\_nom} + \Delta F_{ref} \quad (12)$$

To reduce the scale of the calculation required to obtain the updated Incr value, it is possible to scale the Incr value based on the $\Delta F_{Ref}$ value. Hence $$\text{Incr} = \text{Incr}_{nom} + (\Delta F_{Ref} \cdot \text{Slope}_{256}/X_{Ref\_nom} \cdot 256)) \quad (13)$$

$\text{Incr}_{nom}$ is the Incr value calculated using the nominal frequency of $X_{Ref}$.

$\text{Slope}_{256}$ is a pre-calculated Slope factor across the range of variation in $X_{Ref}$, scaled by 256.

$\text{Slope}_{256}$ is calculated by the following equation:

$$\text{Slope}_{256} = 256 \cdot (\text{Incr}_{Xrefmax} - \text{Incr}_{Xrefmin})/(X_{ref\_max} - X_{ref\_min}) \quad (14)$$

Where
$\text{Incr}_{xrefmax}$ is the Incr value calculated using $X_{ref\_max}$.
$\text{Incr}_{Xrefmin}$ is the Incr value calculated using $X_{ref\_min}$.
$X_{ref\_max}$ is the maximum allowed frequency of $X_{ref}$.
$X_{ref\_min}$ is the minimum allowed frequency of $X_{ref}$.

The invention claimed is:

1. An apparatus comprising:
   a reference oscillator to generate a reference oscillator signal;
   a temperature sensitive oscillator thermally coupled to the reference oscillator and to generate a temperature sensitive oscillator signal;
   a numerically controlled oscillator to receive the reference oscillator signal and generate a clock signal based, at least in part on the reference oscillator signal and an increment value signal;
   a circuit to receive the temperature sensitive oscillator signal, and to generate a control signal based, at least in part, on the temperature sensitive oscillator signal and the clock signal, wherein the control signal comprises information relating to a temperature deviation of the reference oscillator;
   memory to store data indicating a function for determining a deviation of a frequency of the reference oscillator signal; and
   a processor, connected to the memory, to receive the control signal and the reference oscillator signal, access the data in the memory, calculate a set of interpolated values based, at least in part, on the data using piecewise linear interpolation for an anticipated range of temperature deviation of the reference osciliator generate the increment value signal based, at least in part, on one value of the set of interpolated values and provide the increment value signal to the numerically controlled oscillator.

2. The apparatus of claim 1, wherein the function for determining a deviation of the reference oscillator signal comprises a fifth order polynomial.

3. The apparatus of claim 1, wherein the memory is user-writable.

4. The apparatus of claim 1, further comprising a radio localization receiver configured to receive the clock signal generated by the numerically controlled oscillator.

5. The apparatus of claim 4, wherein the radio localization receiver comprises a GPS core.

6. The apparatus of claim 1, wherein the control signal represents a count of the temperature sensitive oscillator signal during a time interval associated with the clock signal, and wherein the processor derives a beat frequency associated with a comparison of the reference oscillator signal and the temperature sensitive oscillator signal based, at least in part, on the count.

7. A method comprising:
   generating a reference oscillator signal with a reference oscillator;
   generating a temperature sensitive oscillator signal with a temperature sensitive oscillator thermally coupled to the reference oscillator;
   generating a clock signal with a numerically controlled oscillator based, at least in cart on the reference and an increment value signal;
   generating a control signal with a circuit based, at least in part, on the temperature sensitive oscillatar signal and the clock signal, wherein the control signal comprises information relating to a temperature deviation of the reference oscillator; and
   with a processor:
      obtaining data, indicating a function for determining a deviation of the reference oscillator signal, from a memory,
      calculating a set of interpolated values based, at least in part, on the data using piecewise linear interpolation for an anticipated range of temperature deviation of the reference oscillator, and
      generating the increment value signal based, at least in part, on one value of the set of interpolated values.

8. The method of claim 7, wherein the function for determining a deviation of the reference oscillator signal comprises a fifth order polynomial.

9. The method of claim 7, wherein the memory is user-writable.

10. The method of claim 7, further comprising providing the clock signal to a radio localization receiver.

11. The method of claim 10, wherein the radio localization receiver comprises a GPS core.

12. The method of claim 7, wherein the control signal represents a count of the temperature sensitive oscillator signal during a time interval associated with the clock signal, and further comprising, with the processor, deriving a beat frequency associated with a comparison of the reference oscillator signal and the temperature sensitive oscillator signal based, at least in part, on the count.

13. An article comprising;

a computer readable medium having computer implementable instructions stored thereon that are executable by one or more processors in a device to:

obtain a reference oscillator signal generated by a reference oscillator, wherein the reference oscillator is thermally coupled to a temperature sensitive oscillator that generates a temperature sensitive oscillator signal;

obtain a control signal generated by a circuit based, at least in part, on the temperature sensitive oscillator signal and a clock signal, wherein the control signal comprises information relating to a temperature deviation of the reference oscillator, and wherein the clock signal is generated by a numerically controlled oscillator based, at least in part on the reference oscillator signal and an increment value signal;

obtain data, indicating a function for determining a deviation of the reference oscillator signal, from a memory;

determine a set of interpolated values based, at least in part, on the data using piecewise linear interpolation for an anticipated range of temperature deviation of the reference oscillator;

generate the increment value signal based, at least in part, on one value of the set of interpolated values; and provide the increment value signal to the numerically controlled oscillator.

14. The article of claim 13 wherein the control signal represents a count of the temperature sensitive oscillator signal during a time interval associated with the clock signal, and wherein the computer implementable instructions are executable by the one or more processors to derive a beat frequency associated with a comparison of the reference oscillator signal and the temperature sensitive oscillator signal based, at least in part, on the count.

* * * * *